United States Patent
Ma et al.

(10) Patent No.: US 10,283,346 B2
(45) Date of Patent: May 7, 2019

(54) SAPPHIRE SUBSTRATE RECYCLING METHOD

(71) Applicant: ENRAYTEK OPTOELECTRONICS CO., LTD., Shanghai (CN)

(72) Inventors: Houyong Ma, Shanghai (CN); Jing Ju, Shanghai (CN); Zhengzhang You, Shanghai (CN); Qiming Li, Shanghai (CN); Jingchao Xie, Shanghai (CN)

(73) Assignee: ENRAYTEK OPTOELECTRONICS CO., LTD., Shanghai (CN)

( * ) Notice: Subject to any disclaimer, the term of this patent is extended or adjusted under 35 U.S.C. 154(b) by 135 days.

(21) Appl. No.: 15/450,355

(22) Filed: Mar. 6, 2017

(65) Prior Publication Data

US 2017/0263446 A1  Sep. 14, 2017

(30) Foreign Application Priority Data

Mar. 8, 2016 (CN) .......................... 2016 1 0129077

(51) Int. Cl.
| | |
|---|---|
| H01L 21/02 | (2006.01) |
| C30B 33/02 | (2006.01) |
| C30B 29/20 | (2006.01) |
| C30B 33/10 | (2006.01) |
| B08B 3/08 | (2006.01) |
| B08B 7/00 | (2006.01) |
| B08B 7/04 | (2006.01) |

(52) U.S. Cl.
CPC .......... *H01L 21/02079* (2013.01); *B08B 3/08* (2013.01); *B08B 7/0071* (2013.01); *B08B 7/04* (2013.01); *C30B 29/20* (2013.01); *C30B 33/02* (2013.01); *C30B 33/10* (2013.01)

(58) Field of Classification Search
None
See application file for complete search history.

(56) References Cited

U.S. PATENT DOCUMENTS 6,445,127 B1 * 9/2002 Oku .................... H01L 33/0012
                                                                257/E33.046

FOREIGN PATENT DOCUMENTS

| CN | 103531685 A | * | 1/2014 |
| CN | 104868020 | | 8/2015 |

OTHER PUBLICATIONS

Espacenet machine translation of CN103531685, retrieved from https://worldwide.espacenet.com/publicationDetails/biblio?CC=CN&NR=103531685A&KC=A&FT=D&ND=3&date=20140122&DB=&locale=en_EP on Sep. 17, 2018 (Year: 2014).*

* cited by examiner

*Primary Examiner* — Eric W Golightly
(74) *Attorney, Agent, or Firm* — Muncy, Geissler, Olds & Lowe, P.C.

(57) ABSTRACT

A method for recycling a sapphire substrate is disclosed. The method includes the steps of: high-temperature baking, wherein an intact epitaxial wafer to be scrapped is placed and baked in a baking oven at a high temperature of from 600° C. to 1000° C., and wherein the epitaxial wafer contains the sapphire substrate; and high-temperature rinsing in a concentrated acid, wherein the baked epitaxial wafer is then rinsed in the concentrated acid having a concentration ranging from 60% to 99% at a high temperature of from 160° C. to 300° C. The method can be used for recycling both patterned and smooth sapphire substrates.

11 Claims, 2 Drawing Sheets

High-temperature Baking — S11

High-temperature Rinsing in Concentrated Acid — S12

SAPPHIRE SUBSTRATE RECYCLING METHOD

TECHNICAL FIELD

The present invention relates to a method for recycling a sapphire substrate and belongs to the field of optoelectronic technology.

BACKGROUND

With technology development and continuing improvement in luminous efficacy, light emitting diodes (LEDs), as a new generation of lighting source, have been vastly used in backlight, display and decorative lighting, and have started to be used in home lighting and outdoor lighting. With LED applications continuing expanding, manufacturers are increasing their investment and R & D effort. On the other hand, due to fluctuations in fabrication processes or unstable and uncontrollable factors in fabrication equipment, it will sometimes happen that intact epitaxial wafers have to be scrapped which, however, contain substrates whose cost accounts for a considerable part of the cost of the epitaxial processes, in particular for large sized substrates developed nowadays. Presently, sapphire substrates have found increasing use in LED fabrication due to a variety of their advantages. For example, they have high mechanical strength and can be produced by well-established processes and used to make high-quality devices.

As the competition in the LED market becomes increasingly intense, there is a need to strip off the epitaxial surface portions of the intact wafers and recycle the sapphire substrates for reuse in order to reduce the production cost. Although intense research efforts have been made in the art, existing methods for sapphire recycling still more or less suffer from some problems such as high cost, high complexity and etc.

Chinese Patent Document CN104868020A discloses a method for sapphire substrate recycling, which includes first high-temperature baking, first rinsing, second high-temperature baking and second rinsing, of an epitaxial wafer, as well as optionally repeating these steps for N times. Since this method requires at least four steps involving repeated baking and rinsing processes, it is tedious and costly.

SUMMARY OF THE INVENTION

The present invention seeks to overcome the drawbacks of the prior art by presenting a method for recycling a sapphire substrate. In general terms, sapphire substrates are categorized into smooth sapphire substrates and patterned sapphire substrates (PSSs). A PSS is fabricated by forming an array of patterns of a particular shape and a size on the order of micro- or nano-meters in a smooth sapphire substrate. The patterns can impart significantly higher crystal quality to an LED epitaxial layer formed on the substrate and enables scattering and reflections on the LED die surface which can result in higher photon extraction efficiency and hence augmented performance of the LED products. According to the method, both patterned and smooth sapphire substrates can be recycled in a short period with high efficiency by a simple process requiring easy operations.

A method for recycling a sapphire substrate according to the present invention comprises the steps of:

high-temperature baking, wherein an intact epitaxial wafer to be scrapped is placed and baked in a baking oven at a high temperature of from 600° C. to 1,400° C., and wherein the epitaxial wafer contains the sapphire substrate; and high-temperature rinsing in a concentrated acid, wherein the baked epitaxial wafer is then rinsed in the concentrated acid having a concentration ranging from 60% to 99% at a high temperature of from 60° C. to 300° C.

Additionally, the high-temperature baking may be carried out for a period of time from 2 hours to 20 hours.

Additionally, the high-temperature baking may be carried out in nitrogen or in a nitrogen and hydrogen mixture.

Additionally, the high-temperature rinsing may be performed at a temperature of 160° C.

Additionally, the high-temperature rinsing may be performed for a period of time of more than 2 minutes.

Additionally, the high-temperature rinsing may be performed for a period of time of 10 minutes.

Additionally, the concentrated acid may be one of hydrochloric acid, sulfuric acid, phosphoric acid and nitric acid, or any mixture thereof.

Additionally, the sapphire substrate may be a patterned or smooth sapphire substrate.

Additionally, the epitaxial wafer may be obtained from a physical or a chemical vapor deposition technique or from an atomic layer deposition technique.

Additionally, the epitaxial wafer may be obtained from a metal organic chemical vapor deposition technique, a hydride vapor phase epitaxy technique or a molecular beam epitaxy technique.

Additionally, the epitaxial wafer may comprise an epitaxial layer which is a single layer, or a stack of multiple layers, of $In_xAl_yGa_{1-x-y}N$, where $0 \le x$, $0 \le y$, and $0 \le x+y \le 1$.

If the PSS or smooth sapphire substrate obtained after the completion of the two steps can meet the requirements of relevant morphological inspection standards, then it is reusable.

Compared to the prior art, the present invention offers the following benefits:

The method involves only two steps, i.e., high-temperature baking and high-temperature rinsing in a concentrated acid, allowing the recycling to be accomplished in a short period with high efficiency at significantly reduced cost by a simple process requiring easy operations. The high-temperature rinsing at 100-300° C. in the concentrated acid following the high-temperature baking allows complete removal of common residues and particles, refractory metal residues, surface oil stains, etc. In addition, the method is applicable to both patterned and smooth sapphire substrates.

The high-temperature baking is performed in nitrogen which can protect the sapphire substrate from damages or in its mixture with hydrogen which can facilitate delamination of the sapphire substrate from the epitaxial layer.

BRIEF DESCRIPTION OF THE DRAWINGS

In FIGS. 2 to 5, 10 denotes the PSS; 11, the smooth sapphire substrate; and 20, an epitaxial layer.

DETAILED DESCRIPTION

A method for recycling a sapphire substrate according to the present invention will be described in greater detail in the following description which presents preferred embodiments of the invention and is to be read in conjunction with the accompanying drawings including the flowchart and schematics. It is to be appreciated that those of skill in the art can make changes in the invention disclosed herein while still obtaining the beneficial results thereof. Therefore, the following description shall be construed as being intended to be widely known by those skilled in the art rather than as limiting the invention.

The present invention will be further described in the following paragraphs by way of examples with reference to the accompanying drawing. Features and advantages of the invention will be more apparent from the following detailed description, and from the appended claims. Note that the accompanying drawings are provided in a very simplified form not necessarily presented to scale, with the only intention of facilitating convenience and clarity in explaining illustrative examples of the invention.

Figure 1:
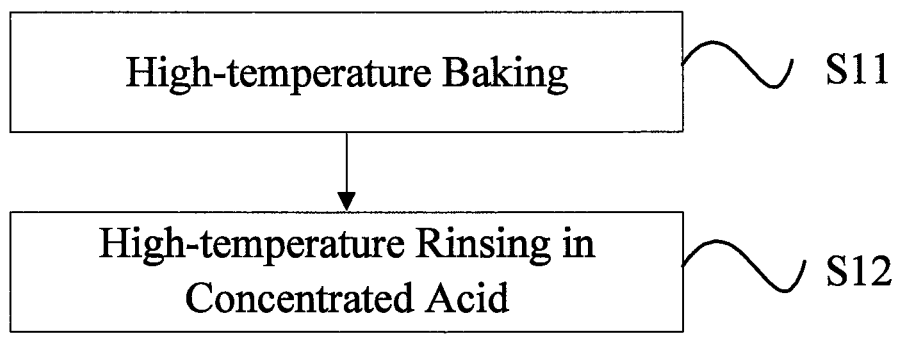
FIG. 1 is a flowchart graphically showing a method for recycling a sapphire substrate in accordance with the present invention.

The present invention is based on a core concept that the method involves only two steps for recycling a sapphire substrate, as shown in FIG. 1.

In step S11, high-temperature baking is performed, in which an intact epitaxial wafer to be scrapped is placed and baked in a baking oven at a temperature ranging from 600° C. to 1400° C., and the epitaxial wafer contains a sapphire substrate.

In step S12, high temperature rinsing in a concentrated acid is performed, in which the baked epitaxial wafer is then rinsed in an acidic solution having a high concentration of 60%-99% at a high temperature between 60° C. and 300° C.

This method entails a simple process which can be completed with high efficiency in a short period by easy operations.

The method is described below in further detail with reference to FIGS. 2 to 5.

Figure 2:
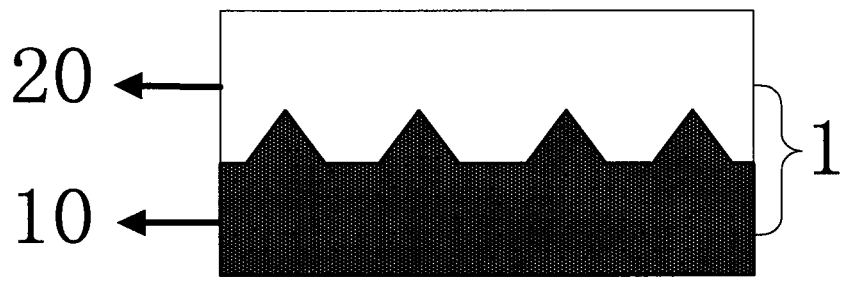
FIG. 2 is a schematic illustration of an intact epitaxial wafer to be scrapped which contains a patterned sapphire substrate (PSS) in accordance with the present invention.
Figure 3:
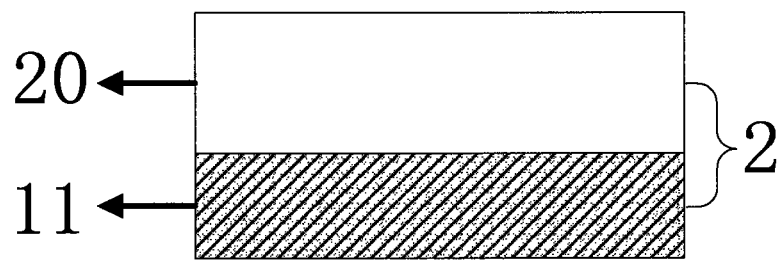
FIG. 3 is a schematic illustration of an intact epitaxial wafer to be scrapped which contains a smooth sapphire substrate in accordance with the present invention.

At first, in step S11, high-temperature baking is carried out, as shown in FIGS. 2 and 3, in which the intact epitaxial wafer 1 or 2 to be scrapped is placed and baked in the baking oven. The epitaxial wafer 1 or 2 may be obtained from a physical or chemical vapor deposition technique or from an atomic layer deposition technique, usually from a metal organic chemical vapor deposition technique, a hydride vapor phase epitaxy technique or a molecular beam epitaxy technique, with the metal organic chemical vapor deposition technique being preferred in the shown embodiment.

The substrate contained in the epitaxial wafer 1 or 2 is a sapphire substrate. Sapphire substrates are generally categorized into smooth sapphire substrates and patterned sapphire substrates (PSSs). As shown in FIG. 2, the substrate in the epitaxial wafer 1 is a PSS 10. In addition to the PSS 10, the epitaxial wafer 1 also has an epitaxial layer 20. As shown in FIG. 3, the substrate contained in the epitaxial wafer 2 is a smooth sapphire substrate 11. Besides it, the epitaxial wafer 2 further has an epitaxial layer 20. Preferably, the epitaxial layer 20 is a single layer of, or a stack of multiple layers of, $In_xAl_yGa_{1-x-y}N$, where $0 \leq x$, $0 \leq y$, $0 \leq x+y \leq 1$, for example, GaN, InGaN, AlGaN or other commonly used semiconductors, including but not limited to, stacked on the sapphire substrate, a non-doped GaN layer, an n-GaN layer, a light-emitting layer and a p-GaN layer.

The high-temperature baking may be performed at a temperature in the range from 600° C. to 1,400° C., for example, 800° C., 1,000° C. or 1,200° C. for a period of time from 2 hours to 20 hours, for example, 4 hours, 8 hours, 12 hours or 16 hours in nitrogen which can protect the PSS 10 or smooth sapphire substrate 11 from damages, or in a nitrogen and hydrogen mixture. Since the introduction of hydrogen can facilitate separation of the epitaxial layer 20 from the PSS 10 or smooth sapphire substrate 11, the nitrogen and hydrogen mixture is preferably used in the shown embodiment.

Following the high-temperature baking, in step S12, high-temperature rinsing is carried out in the concentrated acid. The concentrated acid has a concentration ranging from 60% to 99% and can be implemented as one of hydrochloric acid, sulfuric acid, phosphoric acid and nitric acid, or any mixture thereof, with pure phosphoric acid being preferred in the shown embodiment. The rinsing may be performed at a temperature ranging from 60° C. to 300° C., preferably, for example, 80° C., 160° C. or 240° C., with 160° C. being preferred in the shown embodiment, for a period of time of more than 2 minutes, for example, 4 minutes, 10 minutes, 20 minutes or 30 minutes, with 10 minutes being preferred in the shown embodiment. In other embodiments, the rinsing duration and rinsing temperature may be properly selected so that complete cleaning can be achieved.

Figure 4:
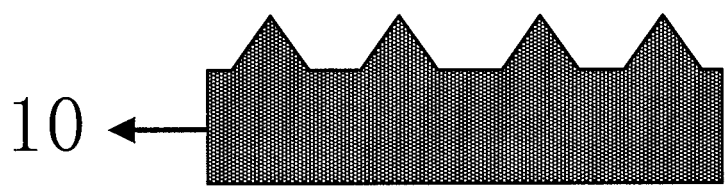
FIG. 4 schematically shows the recycled PSS in accordance with the present invention.
Figure 5:
FIG. 5 schematically shows the recycled smooth sapphire substrate in accordance with the present invention.

As shown in FIGS. 4 and 5, if the PSS 10 or smooth sapphire substrate 11 recycled from the two steps discussed above can meet the requirements of relevant morphological inspection standards, then it is reusable.

In summary, the present invention provides a method for recycling a sapphire substrate, comprising only the two steps of:

high-temperature baking, wherein an intact epitaxial wafer to be scrapped is placed and baked in a baking oven at a high temperature, wherein the high temperature is in the range of from 600° C. to 1,400° C., and wherein the epitaxial wafer contains the sapphire substrate; and high-temperature rinsing in a concentrated acid, wherein the baked epitaxial wafer is then rinsed in the concentrated acid at a high temperature, wherein the concentrated acid comprises a concentration ranging from 60% to 99%; and the high temperature is in the range of from 60° C. to 300° C.

This method entails a simple process which can be completed with high efficiency in a short period by easy operations at significantly reduced cost.

Furthermore, the equipment (e.g., the baking oven and rinsing apparatus), gas and concentrated acid required in the method are all those necessary for the fabrication of LED epitaxial wafers and products. Therefore, with this method, manufactures engaged in the fabrication of these items can recycle sapphire substrates without needing any separate equipment, gas or chemical. This can help them further significantly reduce the recycling cost and hence the LED fabrication cost and be more advantageous in competition and development in the market of LED epitaxial wafers and products.

It is apparent that the foregoing description presents merely preferred embodiments of the present invention and does not limit the scope of the invention in any sense. Those skilled in the art can make various modifications and variations to the invention without departing from the spirit and scope thereof. Accordingly, it is intended that the present invention also include these modifications and variations if they come within the scope of the appended claims and their equivalents.

What is claimed is:

1. A method for recycling a sapphire substrate, comprising the steps of:
high-temperature baking, wherein an intact epitaxial wafer to be scrapped is placed and baked in a baking oven at a high temperature of from 600° C. to 1000° C., and wherein the epitaxial wafer contains the sapphire substrate; and
high-temperature rinsing in a concentrated acid, wherein the baked epitaxial wafer is then rinsed in the concentrated acid having a concentration ranging from 60% to 99% at a high temperature of from 160° C. to 300° C.

2. The method of claim 1, wherein the high-temperature baking is carried out for a period of time from 2 hours to 20 hours.

3. The method of claim 1, wherein the high-temperature baking is carried out in nitrogen or in a nitrogen and hydrogen mixture.

4. The method of claim 1, wherein the high-temperature rinsing is performed at a temperature of 160° C.

5. The method of claim 1, wherein the high-temperature rinsing is performed for a period of time of more than 2 minutes.

6. The method of claim 5, wherein the high-temperature rinsing is performed for a period of time of 10 minutes.

7. The method of claim 1, wherein the concentrated acid is one of hydrochloric acid, sulfuric acid, phosphoric acid and nitric acid, or a mixture thereof.

8. The method of claim 1, wherein the sapphire substrate is a patterned or smooth sapphire substrate.

9. The method of claim 1, wherein the epitaxial wafer is obtained from a physical or a chemical vapor deposition technique or from an atomic layer deposition technique.

10. The method of claim 9, wherein the epitaxial wafer is obtained from a metal organic chemical vapor deposition technique, a hydride vapor phase epitaxy technique or a molecular beam epitaxy technique.

11. The method of claim 1, wherein the epitaxial wafer comprises an epitaxial layer which is a single layer, or a stack of multiple layers, of $In_xAl_yGa_{1-x-y}N$, where $0 \leq x$, $0 \leq y$, and $0 \leq x+y \leq 1$.

* * * * *